United States Patent [19]

Bowling et al.

[11] Patent Number: 4,497,030

[45] Date of Patent: Jan. 29, 1985

[54] N-WAY SUMMING NETWORK CHARACTERIZATION SYSTEM

[75] Inventors: Donald R. Bowling; Darry M. Kinman; Marko Afendykiw, all of Ridgecrest; David J. White, China Lake, all of Calif.

[73] Assignee: The United States of America as represented by the Secretary of the Navy, Washington, D.C.

[21] Appl. No.: 255,621

[22] Filed: Apr. 20, 1981

[51] Int. Cl.³ ............................................. G01S 7/02
[52] U.S. Cl. .................................. 364/481; 343/5 R; 343/17.7; 333/101
[58] Field of Search .............. 364/481; 343/17.7, 5 R; 329/132, 131, 133; 333/101, 104, 105

[56] References Cited

U.S. PATENT DOCUMENTS

| | | | |
|---|---|---|---|
| 3,480,885 | 11/1969 | Schrank | 333/101 |
| 3,739,306 | 6/1973 | Sladek | 333/105 |
| 3,986,148 | 10/1976 | Pollard | 333/101 X |
| 4,024,541 | 5/1977 | Albanese et al. | 343/5 R X |
| 4,145,692 | 3/1979 | Armstrong et al. | 343/17.7 |
| 4,245,221 | 1/1981 | Kipp | 343/17.7 |
| 4,246,535 | 1/1981 | Huang et al. | 364/488 X |
| 4,336,538 | 6/1982 | Radford | 343/5 R |
| 4,359,682 | 11/1982 | Winslow | 364/481 X |

*Primary Examiner*—Edward J. Wise
*Attorney, Agent, or Firm*—Robert F. Beers; W. Thom Skeer; John G. Shudy

[57] ABSTRACT

A system for quasi real-time computer aided characterization of symmetrical N-way microwave power combining structures which utilizes a network analyzer to measure scattering parameters of said combining structure at various RF frequencies and at desired transmission routes through said combining structure. The routes are selected by a coaxial switching network which is controlled by said network analyzer which also computes and outputs the maximum combining efficiency, $\eta$, and the input impedance of the ith port under conditions of maximum combining efficiency, $Z_{ic}$.

7 Claims, 3 Drawing Figures

N-WAY SUMMING NETWORK CHARACTERIZATION SYSTEM

BACKGROUND OF THE INVENTION

1. Field of the Invention

This invention relates to electricity and more particularly to radar transmitter applications. Still more particularly this invention relates to microwave power combining structures for use in solid state radar transmitter application. By way of further characterization this invention relates to computer aided tuning and optimization for maximum efficiency of such solid state microwave power combining structures. Even more particularly this invention relates to quasi real-time computer aided tuning and optimization of solid state microwave power combining structures.

2. Description of the Prior Art

Optimizing microwave power combining circuits has involved tedious, time consuming, expensive, trial and error "tweaking" to achieve optimum overall transmitter performance. For example, to optimally adjust a 16 port summing network using previous methods requires several days of a highly trained technician's time. Further, once optimum transmitter performance has been obtained using the trial and error method, little insight can be gained as to the ultimate achievable performance for a given transmitter design. More significantly, previous methods of transmitter optimization do not provide the designer with sufficient information to evaluate the individual performance of specific summing networks in the overall transmitter design. The designer cannot separately optimize the individual summing networks with their associated matching elements within the transmitter, but rather must through trial and error relate the overall cause and effect of each parameter change, thereby necessitating an expensive and time consuming operation.

SUMMARY OF THE INVENTION

It is the object of the invention to provide a method which permits quasi real-time, computer aided tuning and optimization for maximum efficiency of microwave power combining structures used in solid state radar transmitter applications.

It is a further object of the invention to provide a means for predicting the maximum achievable performance of a wide range of microwave combining circuit topographies.

Another object of the invention is to provide a method that permits the determination of combining circuit impedance parameters which are necessary in designing an efficient solid state transmitter.

To these and other ends, the invention contemplates a semi-automatic N-way summing network alignment system comprising a semi-automatic network analyzer, serving as an analyzer and controller, having a means for inputting a test signal into a summing network, a network analyzer controlled relay which in turn provides a means for remotely controlling the position of the individual switches in a coaxial switching network, connected to said summing network, and a means for connecting the unused input ports of said summing network to ground. The unused input ports may be shorted directly at an input port reference plane to measure the scattering parameters of an N-way summing network with N-2 of the input ports short-circuited or each unused port may be terminated by a fixed resistance to directly measure the scattering parameters for an unmatched summing network. In either instance the measured parameters are used to calculate the maximum potential combining efficiency and the input impedance at the summing network input port reference plane.

These and other objects, features and advantages will become more readily apparent from consideration of the following description of the invention taken in conjunction with the drawings.

DESCRIPTION OF THE PREFERRED EMBODIMENT

Figure 1:
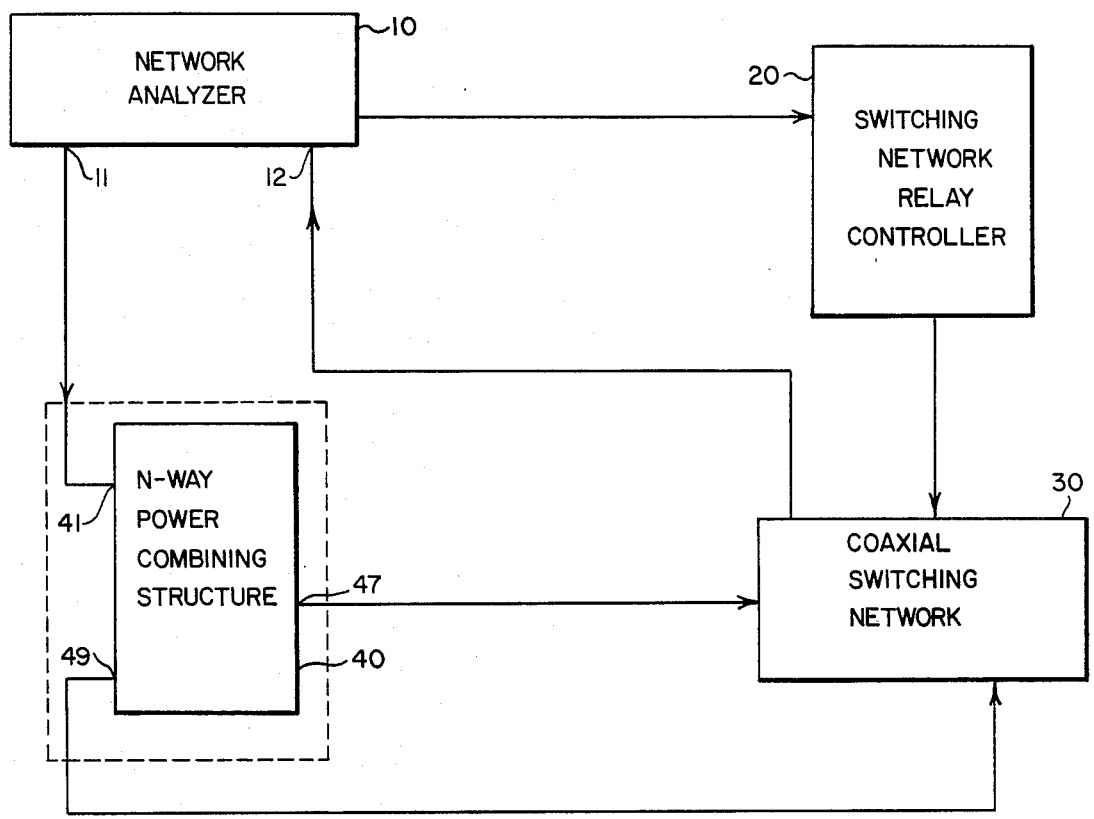
FIG. 1 is a block diagram of the N-way summing network alignment system showing the major components of the semiautomatic network analyzer.

Referring to FIG. 1, a commercially available semi-automatic network analyzer 10 outputs a test signal through test port 11. A HP8409A SANA has been used successfully in testing. The signal is input to an input port 41 on an N-way summing network 40 to be aligned. Power combiners are well known to the skilled artisan; however, the descriptive term power combiner is used interchangeably in some schools with the term summing network; either of which terms is occasionally used to refer to power combining structures which may include associated electronic components such as amplifiers and filters as well as the basic summing network. As used in this disclosure the terms power combiner and power combining structure are used generically to include the basic summing network and its associated active elements. Connected to a sum port 47 of summing network 40 and to an Nth input port 49 of summing network 40 is a coaxial switching network 30. Relay controller 20 receives signals from analyzer 10 which directs it to remotely adjust the positioning of the internal switches of switching network 30.

Figure 2:
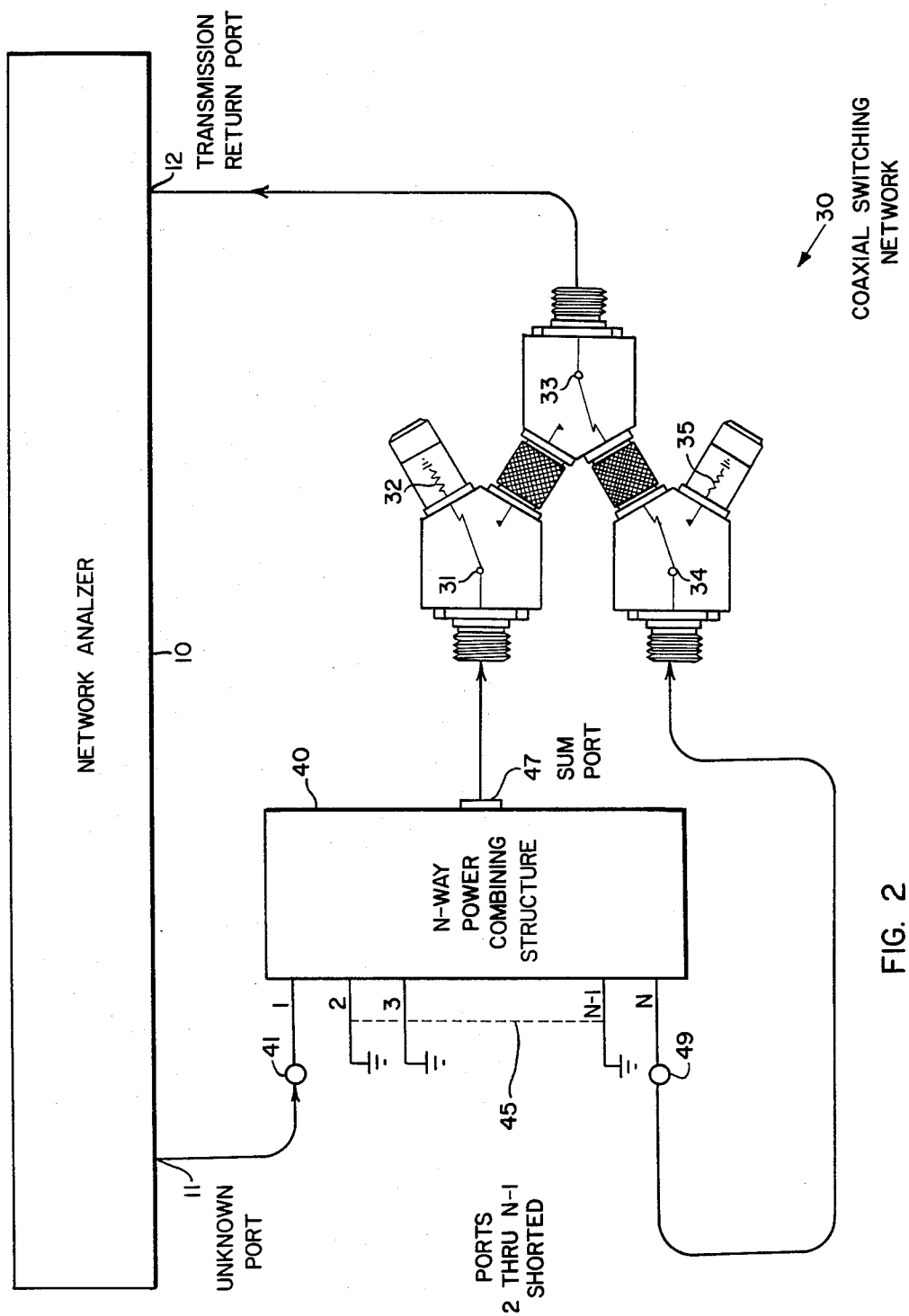
FIG. 2 is a block diagram of the N-way summing network alignment system showing the N-2 input ports of the N-way summing network shorted at a reference plane.

FIG. 2 shows an expanded view of the coaxial switching network illustrating the connection from sum port 47 to a coaxial switch 31. Switch 31 can be individually positioned to terminate in a fixed resistor 32 or to close the circuit to coaxial switch 33. In the test models evaluated the fixed resistors used to terminate the ports of the summing network have been 50 ohm resistors which were found to perform successfully although matched resistors of a different value may work as well. The 50 ohm designation is carried forward throughout the description although it is not intended to be exclusive of other values. Nth port 49 is likewise connected to coaxial switch 34 which can be terminated in a 50 ohm resistor 35 or connected to switch 33. Switch 33 can be positioned to provide a closed circuit from either switch 31 or switch 34 to transmission return port 12 which provides input to analyzer 10. The remaining input ports 45 to N-way summing network 40 are shorted at an input port reference plane such that no short is reflected into summing port 47.

The operation of the N-way summing network alignment system is based on the following equations.

$$S_{j1} = b_{j1} \left[ \frac{1 + b_{11} - b_{j1}}{1 - (N-1)b_{j1} + b_{11}} \right] \quad \text{A}$$

$$S_{\Sigma 1} = b_{\Sigma 1} \left[ \frac{1 + b_{11} - b_{j1}}{1 - (N-1)b_{j1} + b_{11}} \right] \quad \text{B}$$

$$S_{11} = b_{11} + \left[ \frac{(N-2)(b_{j1})^2}{1 + b_{11} - (N-1)b_{j1}} \right] \quad \text{C}$$

wherein:
the S terms represent scattering parameters for unmatched summing network 40;
the b terms represent scattering parameters of an N-way summing network with N-2 of the input port short circuited;
N represents the number of input ports to said network;
j represents the input port connected to said switching network 30; and $$\text{maximum potential combining efficiency} = \eta = \frac{N |S_{\Sigma 1}|^2}{\left| -\sum_{j=1}^{N} S_{j1} \right|^2} \quad \text{D}$$

$$\text{input impedance of } i\text{th port} = Z_{ic} = Z_o \left[ \frac{1 + \sum_{j=1}^{N} S_{j1}}{1 - \sum_{j=1}^{N} S_{j1}} \right] \quad \text{E}$$

wherein $Z_o$ represents the impedance of the network analyzer 10.

The equations provide a straightforward approach for characterization and optimization of power combining structure. Equations A, B, and C relate the classical S-parameters of a summing network to the measurements performed utilizing the configuration of FIG. 2.

In the configuration of FIG. 2 the following measurements would automatically be made:

$b_{11}$—This quantity is determined by measuring the relative amplitude and phase between the incident and reflected signal at input port 41 of summing network 40 under the conditions that the remaining ports 45 are shorted to the reference plane associated with input port 41 and port 49 and sum port 47 are terminated in 50 ohm resistors 32 and 35 by properly positioning coaxial switch 31 and coaxial switch 34.

$b_{j1}$—This quantity is determined by measuring the relative amplitude and phase between the signal incident on port 41 and the signal transmitted through port 49. During this measurement sumport 47 is terminated in 50 ohm resistor 32 by properly positioning coaxial switch 31. The transmission return path for port 49 is selected by properly positioning coaxial switches 33 and 34.

$b_{\Sigma 1}$—This quantity is determined by measuring the relative amplitude and phase between the signal incident upon port 41 and the signal transmitted through sumport 47. During this measurement, port 49 is terminated in 50 ohm resistor 35 by properly positioning coaxial switch 34. The transmission return path for sumport 47 is selected by properly positioning coaxial switches 31 and 33.

Once the quantities $b_{11}$, $b_{j1}$, $b_{\Sigma 1}$ have been determined, equations A, B, and C are used by network analyzer 10 to compute the S-parameters of the N-way summing network 40.

Once the S-parameters have been determined the maximum potential combining efficiency, $\eta$, and the input inpedance of the ith port under conditions of maximum combining efficiency, Zic, can be computed in the analyzer using equations D and E.

In shorting the unused input ports 45 care must be taken to short them at the same reference plane as input port 41 such that no short is reflected into sumport 47. For some summing port configurations shorting unused input ports 45 may be impractical due to inaccessibility of the ports or other reasons. By using matched loads to terminate unused ports 45, the difficulty of matching each unused port to the same reference plane is negated. Further by terminating unused input ports 45 in 50 ohm resistors, network analyzer 10 performs direct measurement of the S-parameters without measuring the b-parameters or using equations A through C.

Figure 3:
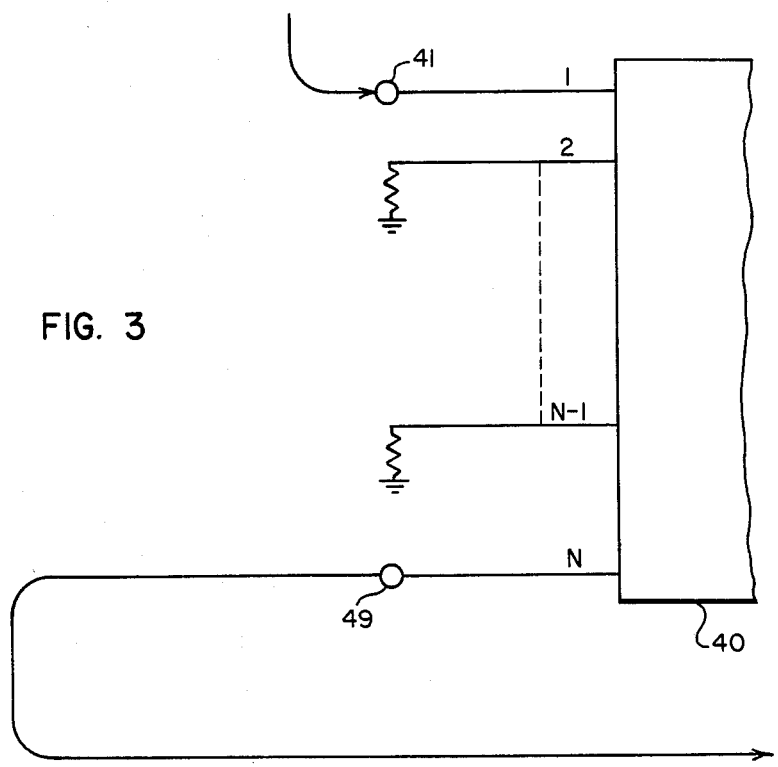
FIG. 3 is a block diagram of the N-way summing network alignment system with N-2 input ports of the N-way summing network terminated in fixed resistance.

The S-parameter measurements parallel the b-parameter measurements as follows. Referring to FIG. 3, note that all unused input ports 45 are terminated in matched resistors during each measurement.

$S_{11}$ is determined by measuring the relative amplitude and phase between the incident and reflected signal at port 41 when port 49 and sumport 47 are terminated in 50 ohm resistors 34 and 35 by the proper positioning of switches 31 and 34.

Network analyzer 10 through relay controller 20 repositions switches 31, 33, and 34. $S_{j1}$ is then determined by measuring the relative amplitude and phase between the signal incident on port 41 and the signal transmitted through port 49 under the condition that sumport 47 is terminated in 50 ohm resistor 32 by the positioning of switch 31.

Network analyzer 10 through relay controller 20 repositions switches 31, 33 and 34 such that port 49 is terminated in 50 ohm resistor 35 and sumport 47 is connected directly to transmitter return port 12 through switches 31 and 33. $S_{\Sigma 1}$ is then determined by measuring the relative amplitude and phase between the signal incident upon port 41 and the signal transmitted through sumport 47.

The S-parameters are then used in equations E and F to compute maximum potential combining efficiency, $\eta$, and the input impedance of the ith port under conditions of maximum combining efficiency, Zic.

The summing network characterization system implements these parameter characterization methods to provide a quasi real-time optimization tool. Summing network 40 is "aligned" by: performing measurements of $b_{11}$, $b_{j1}$, $b_{\Sigma 1}$ or $S_{11}$, $S_{j1}$, and $S_{\Sigma 1}$, depending on the termination of unused ports 45, at various RF frequencies which are near the operating frequency of the power combiner system; $\eta$ and Zic are then computed for each RF frequency by network analyzer 10 using equations A through E; network analyzer 10 also determines the position of switching network 30 through relay controller 20; efficiency and impedance information is output via either hard copy printer or plotter or any other means available to the particular network analyzer selected for use in the system. Network analyzer 10 pauses and allows time for the operator to perform any necessary adjustment indicated by the efficiency and impedance information output. Once the adjustment has been accomplished by the operator and network analyzer control has been resumed the process is continuously repeated. The entire measurement, computation and output cycle can be performed in a few seconds.

While particular embodiments of the invention have been described, and shown, it will be readily apparent to those skilled in the art that changes and modifications may be made without affecting the spirit and the principle of the invention the scope of which is defined in the appended claims.

What is claimed is:

1. A method of quasi real-time computer aided tuning and optimization of symmetrical N-way microwave power combining structures using a network analyzer connected to a coaxial switching network which selects transmission routes through said combining structure, comprising the steps of:
    providing said analyzer with a data base for said combining structure including at least;
        a constant (N) dependent on the number of input ports in said combining structure;
        a constant (Zo) which is the characteristic impedance of said network analyzer;
    limiting the number of input ports of said combining structure available for signal transmission;
    inputting a test signal from said network analyzer to one of the open input ports of said combining structure;
    measuring the scattering parameters of said power combining structure at various RF frequencies utilizing various transmission paths through said power combining structure;
    calculating in said analyzer the maximum potential combining efficiency, $\eta$, and the input impedance of the ith port under conditions of maximum combining efficiency, Zic, at each RF frequency desired; and
    outputting said efficiency, $\eta$, and impedance, Zic, for each RF frequency in tangible form for use by an operator in aligning said power combining structure for optimum performance.

2. The method according to claim 1 wherein said limiting step is accomplished by shorting N-2 input ports of said N-way power combining structure to a reference plane associated with the unshorted input ports.

3. The method of claim 2 wherein the measuring the scattering parameters $b_{11}$, $b_{j1}$, and $b_{\Sigma 1}$ of an N-way power combining structure with N-2 input ports short circuited comprises the steps of:
    measuring the relative amplitude and phase between the incident and reflected signal at the test input port under the condition such that the sum port of said combining structure and the remaining input port of the combining structure are terminated in matched resistors of a predetermined resistance by said coaxial switching network to determine a value for $b_{11}$;
    measuring the relative amplitude and phase between the incident signal at the test input port and the signal transmitted through the coaxial switching network under the conditions such that the sum port of said combining structure is terminated in a resistor of predetermined resistance and the remaining input port of said combining structure is connected to an input to said analyzer by said coaxial switching network, to determine $b_{j1}$; and measuring the relative amplitude and phase between the signal incident on the test signal input port and the signal transmitted through the sumport to said network analyzer, with the remaining input port to said combining structure terminated in a resistor of predetermined resistance by said coaxial switching network, to determine $b_{\Sigma 1}$.

4. The method according to claim 3 wherein said calculating step comprises the steps of:
    calculating in said analyzer the classical scattering parameters S for an unmatched power combining structure using the equations $$S_{j1} = b_{j1}\left[\frac{1 + b_{11} - b_{j1}}{1 - (N-1)b_{j1} + b_{11}}\right]$$

$$S_{\Sigma 1} = b_{\Sigma 1}\left[\frac{1 + b_{11} - b_{j1}}{1 - (N-1)b_{j1} + b_{11}}\right]$$

and $$S_{11} = b_{11} + \left[\frac{(N-2)(b_{j1})^2}{1 + b_{11} - (N-1)b_{j1}}\right]$$

calculating in said network analyzer, the maximum potential combining efficiency, $\eta$, and the impedance of the ith port under conditions of maximum combining efficiency, Zic, using the equations $$\eta = \frac{N|S_{\Sigma 1}|^2}{\left|1 - \left|\sum_{j=1}^{N} S_{j1}\right|\right|^2}$$

and $$Zic = Zo\left[\frac{1 + \sum_{j=1}^{N} S_{j1}}{1 - \sum_{j=1}^{N} S_{j1}}\right]$$

wherein
    N = the number of input ports to said power combining structure,
    Zo = the impedance of said network analyzer, and
    j = the input port connected to said switching network.

5. The method according to claim 1 wherein said limiting step is accomplished by terminating N-2 of the input ports of said power combining structure in matched individual resistors of a predetermined resistance.

6. The method according to claim 5 wherein the classical S-parameters of an unmatched power combining structure are determined at various RF frequencies by said measuring step comprising the steps of:
    determining a value of $S_{11}$ by measuring the relative amplitude and phase of the incident and reflected signal at said test input port when both said summing port and said Nth port are terminated in matched resistors of a predetermined resistance by said coaxial switching network;

determining a value of $S_{j1}$ by measuring the relative amplitude and phase between the incident signal at said test input port and the signal transmitted through said coaxial switch, network under conditions such that the sum port of said power combining structure is terminated in a resistor of predetermined resistance by said switching network and the Nth input port of said power combining structure is connected to said network analyzer by said switching network; and determining a value of $S_{\Sigma 1}$ by measuring the relative amplitude and phase between a signal incident on said test input port and the signal transmitted through said sum port and switching network to said network analyzer when said Nth input port is terminated in a resistor of a predetermined resistance by said switching network.

7. The method according to claim 6 wherein said calculating step comprises calculating in said analyzer said maximum efficiency, $\eta$, and said impedance, Zic, using the equations $$\eta = \frac{N \, |S_{\Sigma 1}|^2}{\left| - \left| \sum_{j=1}^{N} S_{j1} \right| \right|^2}$$

and $$Zic = Zo \left[ \frac{1 + \sum_{j=1}^{N} S_{j1}}{1 - \sum_{j=1}^{N} S_{j1}} \right]$$

for each RF frequency.

* * * * *